(12) United States Patent
Cooper (10) Patent No.: US 6,653,950 B2
(45) Date of Patent: Nov. 25, 2003

(54) DATA COMPRESSION METHOD AND APPARATUS UTILIZING CASCADED SUBDICTIONARIES

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/951,263

(22) Filed: Sep. 13, 2001

(65) Prior Publication Data

US 2003/0102988 A1 Jun. 5, 2003

(51) Int. Cl.$^7$ ................................................. H03M 7/34
(52) U.S. Cl. ............................. 341/51; 341/50; 341/85; 341/106; 341/57
(58) Field of Search .................................. 341/50–109

(56) References Cited

U.S. PATENT DOCUMENTS

| | | | | |
|---|---|---|---|---|
| 4,814,746 A | * | 3/1989 | Miller et al. .................... | 341/95 |
| 5,179,378 A | * | 1/1993 | Ranganathan et al. ......... | 341/51 |
| 5,293,164 A | * | 3/1994 | Bugajski et al. ............... | 341/51 |
| 5,442,350 A | * | 8/1995 | Iyer et al. ..................... | 341/106 |
| 5,592,667 A | * | 1/1997 | Bugajski ....................... | 341/51 |
| 5,642,112 A | * | 6/1997 | Cooper ......................... | 341/106 |
| 5,838,264 A | * | 11/1998 | Cooper ......................... | 341/106 |
| 5,861,827 A | * | 1/1999 | Welch et al. .................. | 341/51 |
| 6,018,303 A | * | 1/2000 | Sadeh ........................... | 341/51 |

OTHER PUBLICATIONS

Ming–Bo Lin; Journal of VLSI Signal Processing Systems for Signal, Image and Video Techonologg; "A Hardware Architecuted of the LZW Compression and Decompression Algorithms Based on Parallel Dictionaries"; pp 369–381; (Kluwer Academic Publishers, vol. 26, No. 3, Nov. 2000).*
Ming–Bo Lin; Journal of VLSI Signal Processing Systems for Signal, Image, and Video Technology; "A Hardware Architecture for the LZW Compression and Decompression Algorithms Based on Parallel Dictionaries"; pp 369–381; (Kluwer Academic Publishers, vol. 26, No. 3, Nov. 2000).
K.S. Ng, et al; Proceedings of the 4$^{th}$ International Conference on Document Analysis and Recognition (ICDAR; "Dynamic Word Based Text Compression", pp. 412–416, (Proceedings of the ICDAR, Los Alamitos, IEEE Comp. Soc, US, vol. II, Aug. 18, 1997).

* cited by examiner

Primary Examiner—Michael Tokar
Assistant Examiner—Linh Van Nguyen
(74) Attorney, Agent, or Firm—Albert B. Cooper; Michael B. Atlass; Mark T. Starr (57) ABSTRACT

The data compressor utilizes a plurality of subdictionaries arranged in levels for storing strings of data characters. The subdictionary at the first level stores two character strings and a subdictionary at a subsequent level stores strings that are one character longer than the strings stored in the subdictionary at the level prior thereto. A plurality of data characters are fetched from the input into an input buffer and applied to the respective levels. The subdictionary at a level is searched for the string comprising the string matched at the prior level extended by the fetched character applied to the level. The string code of a string matched at a level is cascaded to the next level. The longest match with the fetched characters is determined by one of the fetched characters resulting in a mismatch at one of the levels. The string code associated with the longest match is output. An extended string comprising the longest match extended by the fetched character that resulted in the mismatch is inserted into the subdictionary at the mismatching level.

38 Claims, 7 Drawing Sheets

DATA COMPRESSION METHOD AND APPARATUS UTILIZING CASCADED SUBDICTIONARIES

BACKGROUND OF THE INVENTION

1. Field of the Invention

The invention relates to LZ dictionary based data compression systems particularly with respect to the LZW compression methodology. More particularly, the invention relates to a parallel architecture for storing and accessing data character strings in the compressor.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, July 31, 1990. TIFF is a development of Aldus Corporation and the name TIFF is a Trademark thereof. Reference to the TIFF specification is found in TIFF, Revision 6.0, Final—Jun. 3, 1992.

Further examples of LZ dictionary based compression and decompression systems are described in the following U.S. Pat. No. : 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; U.S. Pat. No. 5,861,827 by Welch et al., issued Jan. 19, 1999; and U.S. Pat. No. 6,188,333 by Cooper, issued Feb. 13, 2001.

In dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known search tree architectures and protocols. Typically, the search for the longest matching string stored in the dictionary is an iterative process where sequentially matched strings in the dictionary are extended by sequentially fetched input characters, respectively, until the longest matching string is determined. At each iteration, the dictionary is accessed to determine if the new string extension is a previously stored dictionary entry. Potentially, at each iteration, access to all of the strings stored in the dictionary may be effected to determine the required information. For example, in systems implemented utilizing an associative memory dictionary, such as in said U.S. Pat. Nos. 5,373,290 and 5,838,264, it may be necessary, at an iteration, to access all dictionary locations to determine that an extended string is not stored therein.

The conventional iterative protocols, therefore, tend to be time consuming. Although the known dictionary architectures and protocols provide efficient data compression systems, it is a continuing objective in the art to improve compressor performance.

SUMMARY OF THE INVENTION

The present invention provides new string storage and access architecture and protocols which, it is believed, will improve the speed of dictionary based LZ type data compressors.

In the present invention, a plurality of subdictionaries are arranged in levels for storing strings of data characters encountered in the input stream. The strings stored in a subdictionary have the same number of characters with respect to each other and the strings stored in the subdictionary of a level have one character more than the strings stored in the subdictionary at the level prior thereto. A plurality of data characters are fetched from the input and applied to the levels, respectively. The fetched characters are searched by comparing the fetched characters to the stored strings to determine the longest match therewith. The longest match is determined by one of the fetched characters resulting in a mismatch at one of the levels. The string code associated with the longest match is output so as to provide the output stream of compressed codes corresponding to the input stream of data characters. An extended string comprising the longest match extended by the fetched character that resulted in the mismatch is inserted into the subdictionary at the mismatching level.

In particular, the fetched characters are searched by searching the strings stored at a particular level for a string comprising a string matched at the level prior thereto extended by the fetched character applied to the particular level. The string code of a string matched at the particular level is applied to the next level in cascade fashion.

A best mode embodiment of the invention includes an auxiliary table at each of the levels except for the first level. While the subdictionary at the first level is being searched for a 2 character string match, each of the subdictionaries at the remaining levels is screened for stored strings ending in the fetched input character applied to the level. The screened strings are transferred to the corresponding auxiliary table. At a level, the cascaded string code from the previous level is searched in the auxiliary table.

DESCRIPTION OF THE PREFERRED EMBODIMENTS

The best mode embodiments described below are predicated, generally, on the LZW methodology. The embodiments conveniently utilize an implementation feature similar to that described above where the single character strings are considered as recognized by the compressor although not explicitly initialized therein. It is appreciated that the invention may be embodied with alternative implementation features such as a non-initialized arrangement as well as a configuration where the compressor is explicitly initialized with all of the single character strings.

Figure 1:
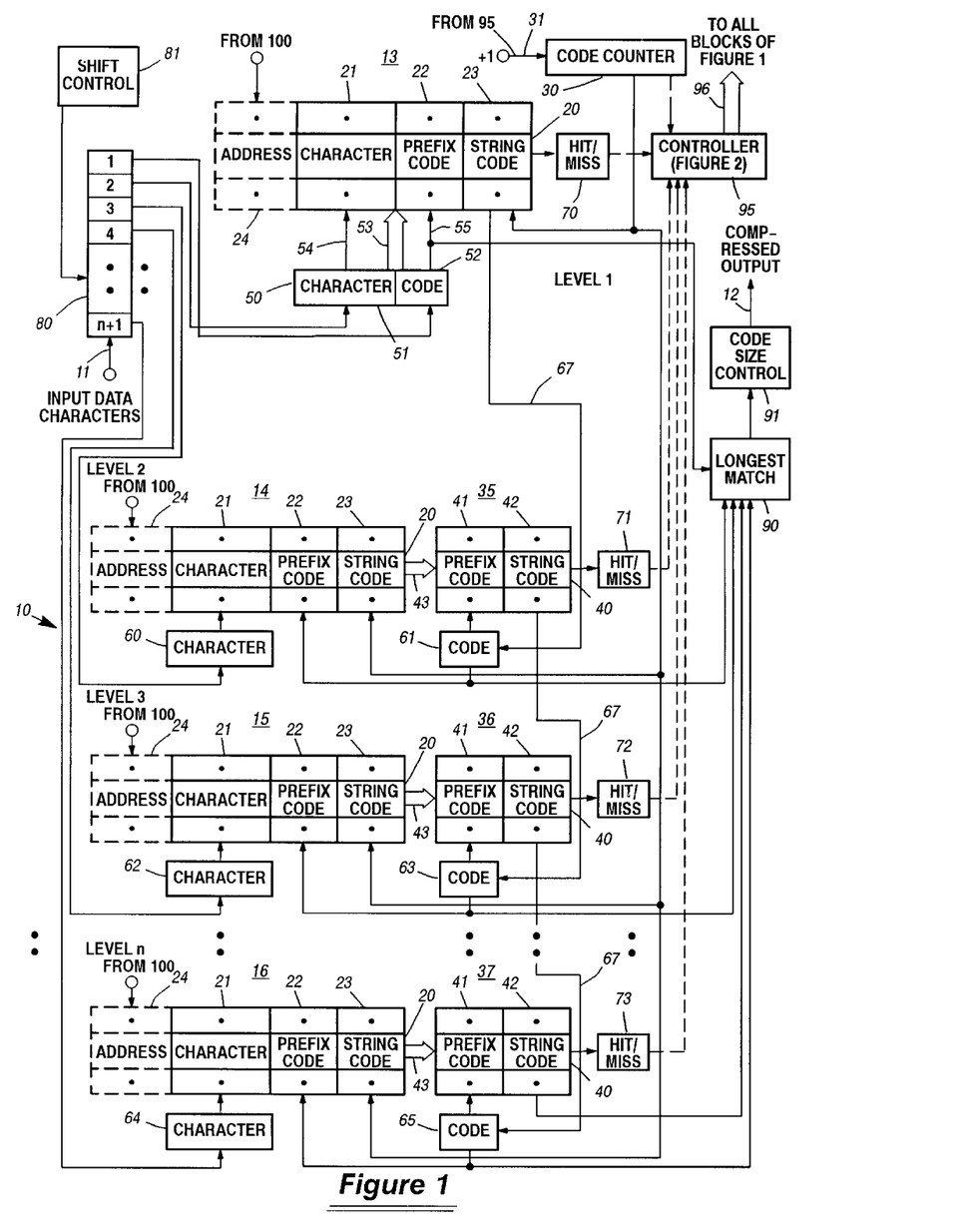
FIG. 1 is a schematic block diagram of a data compressor for compressing data in accordance with a best mode embodiment of the present invention.

Referring to FIG. 1, a data compressor 10 is illustrated that compresses a stream of input data characters applied at an input 11 into a stream of corresponding compressed codes at an output 12. The compressor 10 is arranged in levels denoted as levels 1 to n which include respective subdictionaries 13–16. Each of the subdictionaries 13–16 is comprised of a plurality of subdictionary locations 20 for storing strings of data characters encountered at the input 11. Each subdictionary location 20 is comprised of a character field 21, a prefix code field 22 and a string code field 23. The subdictionary locations 20 are accessed by respective addresses 24.

A data character string is comprised of a prefix string of one or more characters of the alphabet over which compression is being performed followed by an extension character. A string is stored in a subdictionary by storing the code of the string prefix in the prefix code field 22 and the extension character of the string in the character field 21. The code of the string is stored in the string code field 23. The string code assigned to the stored string is provided from a code counter 30 which is incremented by 1 via an input 31. The addresses 24 are utilized to access the locations 20 for string storage and read-out. By the operations of the compressor 10 to be described, it will be appreciated that the subdictionaries 13–16 will store exclusively 2, 3, 4, . . . and n+1 character strings, respectively.

Included at levels 2 to n are respective auxiliary tables 35–37. Each of the tables 35–37 is comprised of a plurality of table locations 40 for storing the prefix code and string code of strings selectively transferred from the associated subdictionary 14–16. Accordingly, each of the locations 40 includes a prefix code field 41 and a string code field 42. It is appreciated that the plurality of prefix codes 41 in an auxiliary table form a prefix code list utilized for table look-up in a manner to be described. The transfer of the prefix codes and string codes from each of the subdictionaries 14–16 to the associated auxiliary table 35–37 is denoted by an arrow 43. In a manner to be further described, the strings transferred from a subdictionary to the associated auxiliary table during a search for a longest match will be those strings stored in the subdictionary that have a particular extension character.

At level 1, a register 50 is included having a character field 51 and a code field 52. The register 50 is arranged with respect to the subdictionary 13 for associatively searching for a string stored in the subdictionary 13 having a prefix code in the field 22 matching the code in the register field 52 and an extension character in the field 21 matching the character in the register field 51. The associative search is denoted by an arrow 53.

An extended string is stored in the subdictionary 13 by writing the code in the register code field 52 and the character in the register character field 51 into the prefix code field 22 and character field 21, respectively, at a location in the subdictionary 13 selected by the address 24. The extended string storage function is denoted by arrows 54 and 55. Operations of the subdictionary 13 as an associative memory are described in detail in said U.S. Pat. No. 5,838,264.

At level 2, a character register 60 is associated with the character field 21 of the subdictionary 14 and a code register 61 is associated with the prefix code field 41 of the auxiliary table 35. The character register 60 is utilized to identify the strings stored in the subdictionary 14 having as the string extension character, the character stored in the register 60. The prefix code and string code of each identified string is transferred to the auxiliary table 35.

The code register 61 is utilized to determine if the code in the register 61 is contained in the prefix code list 41 of the auxiliary table 35. The code in the register 61 is utilized to perform a look-up in the auxiliary table 35 to locate a matching prefix code in the prefix code list 41 so as to provide the corresponding string code. Additionally, in the manner described above with respect to level 1, the character in the character register 60 and the code in the code register 61 are utilized to store an extended string in the subdictionary 14.

Levels 3 to n include character and code registers 62–65 to perform the functions described with respect to the character register 60 and code register 61 of level 2.

For reasons to be described below, the string code from the field 23 of the subdictionary 13 is cascaded into the code register 61. In a similar manner, the string code from the field 42 of the auxiliary table 35 is cascaded into the code register 63. The cascading continues from the string code field 42 of auxiliary table 36 of level 3 through the intervening levels to the code register 65 of level n. The cascading is implemented by paths 67.

A hit/miss circuit 70 is coupled to the subdictionary 13 of level 1 to provide a "hit" signal if the string in the register 50 is stored in the subdictionary 13 or a "miss" signal if the string in the register 50 is not stored in the subdictionary 13. While the subdictionary 13 is being searched pending the hit or the miss, neither signal is provided. In this manner the hit/miss circuit 70 provides a definite indication when the determination is made that the string is or is not stored. The search may be performed associatively, sequencing through the addresses 24 of all of the strings previously stored in the subdictionary 13.

At level 2, a similar hit/miss circuit 71 is coupled to the auxiliary table 35. In the manner described above with respect to the hit/miss circuit 70, the hit/miss circuit 71 provides the "hit" signal when the code in the code register 61 matches a code in the prefix code list 41 of the auxiliary table 35. The "miss" signal is provided by the circuit 71 when the determination is made that the code in the register 61 is not in the prefix code list 41. The levels 3 to n include similar respective hit/miss circuits, such as the circuits 72 and 73 where the descriptions given with respect to the hit/miss circuit 71 of level 2 also apply thereto.

The compressor 10 includes an input character buffer 80 for holding n+1 consecutive characters from the input 11. Accordingly, the stages of the buffer 80 are denoted as 1 to n+1. The first and second stages of the buffer 80 are coupled, respectively, to the code field 52 and the character field 51 of the level 1 register 50. The stages 3 to n+1 of the buffer 80 are coupled to the character registers 60, 62 and 64 of levels 2 to n, respectively. A shift control circuit 81 controls shifting of the buffer 80 so that new input characters are fetched into the n+1 stage while processed characters are discarded from the first stage.

By operations to be described, the compressor 10 determines the longest match of the n+1 characters in the buffer 80 with the strings stored in the subdictionaries 13–16. The appropriate code of the determined longest match is transferred to a longest match register 90. The code of the longest match is selectively provided from either the code field 52 of the register 50 of level 1, one of the code registers 61, 63, 65 of levels 2 to n, or the string code field of a selected location in the auxiliary table 37 of level n. A code size control circuit 91 is utilized, in a well known manner, to control the number of bits used for transmitting the compressed code from the output 12.

The compressor 10 includes a controller 95 for controlling the functions to be performed. The controller 95 receives control inputs (denoted by dashed lines) from the code counter 30 and the hit/miss circuits 70–73 and provides control signals to all of the blocks of FIG. 1 as depicted by an arrow 96. Further details of the controller 95 are illustrated in FIG. 2.

Figure 2:
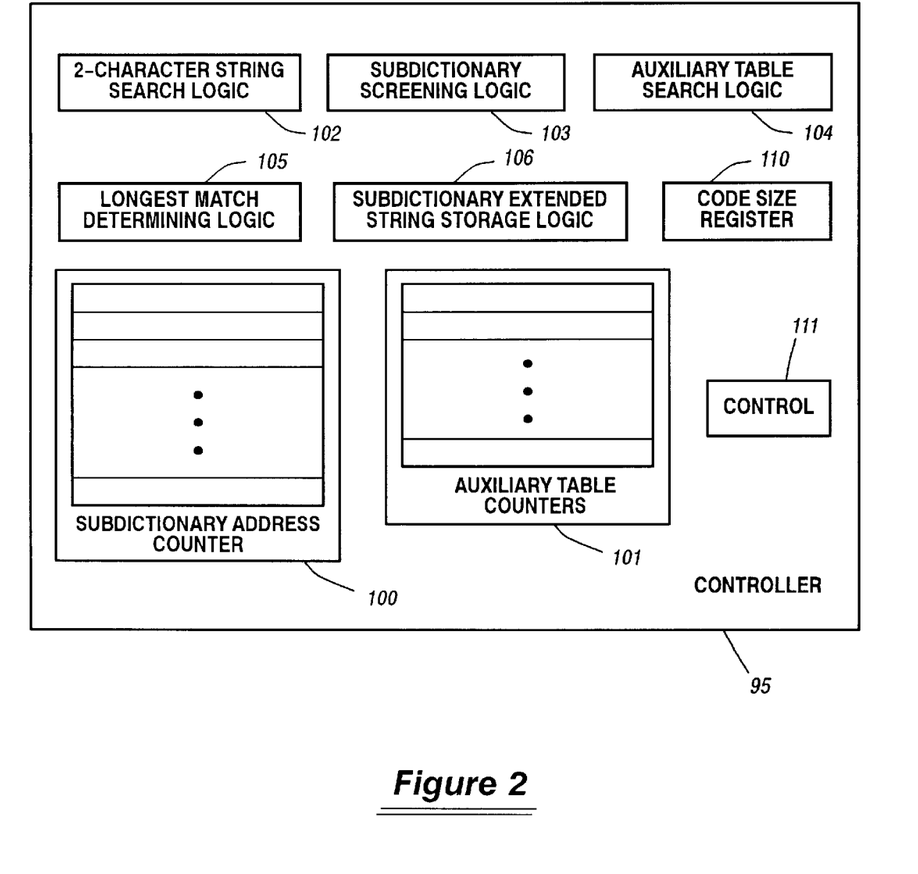
FIG. 2 is a schematic block diagram illustrating details of the controller of the embodiment of FIG. 1.

Referring to FIG. 2, with continued reference to FIG. 1, the controller 95 includes a plurality of subdictionary address counters 100 corresponding, respectively, to the subdictionaries 13–16. The subdictionary address counter corresponding to a subdictionary is utilized by the controller 95 to access locations in the subdictionary via the addresses 24. When an extended string is stored in a subdictionary, the string is stored at the next available address indicated by the corresponding subdictionary address counter 100 and the address counter 100 is thereafter advanced to the next count. For example, the subdictionary address counts may be advanced sequentially. Thus, the subdictionary address counter 100 corresponding to the subdictionary provides an indication utilized by the controller 95 to determine which addresses in the subdictionary contain stored strings.

The controller 95 further includes a plurality of auxiliary table counters 101 corresponding, respectively, to the auxiliary tables 35–37. The controller 95 utilizes the auxiliary table counter 101 corresponding to an auxiliary table for maintaining a count of the number of strings stored in the auxiliary table.

The controller 95 further includes 2-character string search logic 102, subdictionary screening logic 103, auxiliary table search logic 104, longest match determining logic 105 and subdictionary extended string storage logic 106.

The 2-character string search logic 102 is utilized by the controller 95 to determine if the string represented by the character and prefix code held in the register 50 is stored in the subdictionary 13. The subdictionary 13 is searched associatively utilizing the corresponding subdictionary address counter 100. Since this corresponding subdictionary address counter 100 provides an indication of the address in the subdictionary 13 at which the last string was stored, the logic 102 only examines the locations of the subdictionary 13 at which strings are stored to determine if a match exists.

The subdictionary screening logic 103 is utilized by the controller 95 to simultaneously screen from the respective subdictionaries 14–16 of levels 2 to n, the strings stored therein that end in the characters held in the corresponding character registers 60, 62 and 64. The prefix code and string code of the screened strings are transferred to the corresponding auxiliary tables 35–37. The subdictionary screening logic 103 utilizes the corresponding auxiliary table counters 100 to maintain respective counts of the number of strings transferred and stored in the corresponding auxiliary tables. Thus, when the subdictionary screening logic 103 transfers a screened string from the subdictionary to the corresponding auxiliary table, the corresponding auxiliary table counter 101 is incremented.

The auxiliary table search logic 104 is utilized by the controller 95 to determine if the codes held in the code registers 61, 63 and 65 of levels 2 to n are contained in the respective prefix code lists 41 of the corresponding auxiliary tables 35–37. The auxiliary table search logic 104 utilizes the auxiliary table counters 101 corresponding to the auxiliary tables 35–37 so that only locations in the auxiliary tables 35–37 that are storing strings are examined.

The longest match determining logic 105 examines the status of the hit/miss circuits 70–73. A mismatching level is determined when a hit/miss circuit at a level provides the "miss" signal while all of the hit/miss circuits at the prior levels are providing the "hit" signal. The level at which the hit/miss circuit provides the "miss" signal is the mismatching level. The code held in the code register 61, 63 or 65 at the mismatching level is the code of the longest match and this code is transferred to the longest match register 90. The character held in the character register 60, 62 or 64 at the mismatching level is the mismatching character that "broke" the match.

If the hit/miss circuit 70 indicates the "miss" signal, the code of the longest match is taken from the code field 52 of the register 50 of level 1.

If all of the hit/miss circuits 70–73 provide the "hit" signal, the code of the longest match is taken from the string code field 42 of the auxiliary table 37 at the location containing the prefix code matching the code held in the register 65.

The subdictionary extended string storage logic 106 is utilized to store the appropriate extended string in the appropriate subdictionary. At the mismatching level 2 to n, the character held in the associated character register 60, 62 or 64 and the code held in the corresponding code register 61, 63 or 65 are stored in the character field 21 and prefix code field 22, respectively, of the associated subdictionary 14–16. If level 1 is the mismatching level, the character and prefix code of the extended string are provided to the subdictionary 13 by the register 50.

The string code for the stored extended string is provided to the string code field 23 of the associated subdictionary from the code counter 30. The code counter 30 is advanced to the next available string code. The location in the associated subdictionary in which to store the extended string is determined by the corresponding subdictionary address counter 100. After storing the extended string in the appropriate subdictionary, the associated subdictionary address counter 100 is advanced to the next address.

The controller 95 further includes a code size register 110 for determining the code size utilized by the code size control 91 for transmitting the compressed codes on the output 12. The code size in the code size register 110 is set in accordance with the count in the code counter 30 in a well known manner. The code size is set to an initial value and incremented at predetermined codes of the code counter 30 until a maximum code size is attained. For example, in an ASCII variable length code implementation, the code size may begin with 9 bits and sequentially increase to 10, 11 and 12 bits at codes. 512, 1024 and 2048, respectively. It is appreciated that a fixed code size may also be utilized with appropriate modifications to the embodiment.

The controller 95 also includes control circuit 111 for controlling the detailed operations to be executed by the compressor 10. The control circuit 111 is considered as containing appropriate circuitry, such as state machines, or appropriate software, to control execution of the operations.

Figure 3:
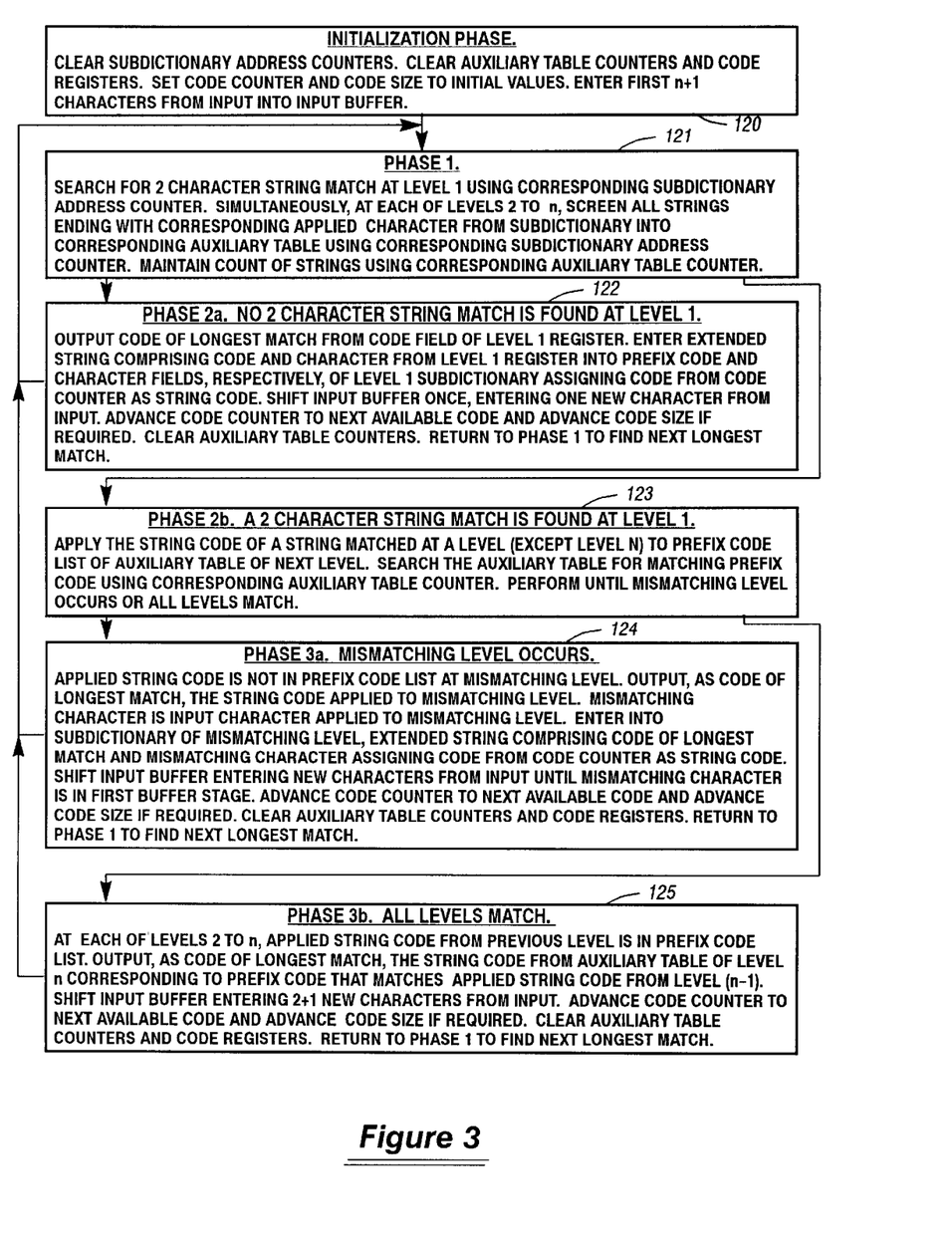
FIG. 3 is a chart summarizing the functions and illustrating the operational flow of the FIGS. 1 and 2 embodiment.

Referring to FIG. 3, with continued reference to FIGS. 1 and 2, a summary and flow diagram of the operations performed by the compressor 10 is illustrated. The operations are described in terms of an initialization phase and repetitive operational phases 1, 2 and 3. The initialization phase is denoted by a block 120, phase 1 by a block 121, phase 2 by blocks 122 and 123 and phase 3 by blocks 124 and 125.

At initialization phase block 120, the subdictionary address counters 100 and the auxiliary table counters 101 are cleared as are the code registers 61, 63 and 65 of levels 2 to n. Additionally, at the block 120, the code counter 30 and the code size register 110 are set to initial values. For example, in an ASCII environment, the code counter 30 may be set to a first available code of 258 and the code size register 110 may be set to an initial code size of 9 bits.

Further at the block 120, the first n+1 characters from the input 11 are entered into the input buffer 80 with the first character of the input stream residing in the first stage of the buffer. Although serial data entry is illustrated, parallel data entry into the n+1 stages of the buffer 80 may alternatively be utilized. It is appreciated that the clearing, setting and data entering operations of the block 120 may be simultaneously performed.

During each iteration of the compressor 10, the operations of phases 1–3 determine the longest string in the buffer 80 that matches a string stored in the subdictionaries 13–16 of levels 1 to n. The code of the longest match is provided at the compressed output 12 and the input buffer 80 is shifted, in preparation for the next longest match search iteration, so that the mismatching character resides in the first stage thereof. New characters from the input 11 are entered at stage n+1 to replace the already processed characters.

At the beginning of each iteration of the compressor 10, processing enters the phase 1 block 121. At the block 121, the subdictionary 13 is searched, utilizing the logic 102, for the 2 character string represented by the prefix code and character held in the register 50. The search may be performed associatively, as described above, by examining the locations of the subdictionary 13 that are storing previously entered strings. The associated subdictionary address counter 100 is utilized by the controller 95 to determine which addresses 24 of the subdictionary 13 to examine so as to only access locations at which strings are stored. If the string held in the register 50 is stored at an examined location, the "hit" signal is provided by the hit/miss circuit 70. If the string is not stored in the subdictionary 13, the "miss" signal is indicated. It is appreciated that the examined locations of the subdictionary 13 accessed by the addresses 24 are searched for the 2 character string comprising the character in the first stage of the input buffer 80 extended by the character in the second stage of the input buffer 80. For all of the longest match search iterations but the initial iteration, the first stage of the buffer 80 is holding the mismatching character from the previous longest match iteration and the second stage of the buffer 80 is holding the next following character in the input data stream.

Further at the phase 1 block 121, and simultaneously with the search for the 2 character string at level 1, the subdictionaries 14–16 at the levels 2 to n are simultaneously screened, utilizing the logic 103, for the strings in each subdictionary that end with the character in the corresponding character register 60, 62 and 64. As previously described, the character registers 60, 62 and 64 are holding the respective characters in the third to n+1 stages of the input buffer 80. To perform the screening, the controller 95 examines only the locations in each subdictionary 14–16 storing previously entered strings. The subdictionary address counters 100 corresponding to the subdictionaries 14–16 are utilized by the controller 95 to access only addresses 24 at which strings are stored. In order to screen the appropriate strings, the characters in the fields 21 are compared with the character values held in the corresponding character register 60, 62 and 64. As the appropriate strings are identified, the prefix codes and string codes thereof are transferred from the prefix code fields 22 and string code fields 23 of the subdictionaries 14–16 to the prefix code fields 41 and the string code fields 42 of the corresponding auxiliary tables 35–37. As each string transfer is effected, the corresponding auxiliary table counter 101 is incremented to maintain a count of the number of strings transferred to the corresponding auxiliary table.

It is appreciated that the strings transferred to the auxiliary tables are potential candidate 3, 4, . . . , n+1 character strings for matching with the n+1 character string held in the input buffer 80 in the search for the longest match.

If the "miss" signal from the hit/miss circuit 70 occurs at the block 121, no 2 character string match is found at level 1 and processing enters the phase 2*a* block 122. At the block 122, the code of the longest match is transferred from the code field 52 of the register 50 to the longest match register 90. The code of the longest match is provided at the output 12 in the appropriate number of bits controlled by the code size control circuit 91. It is appreciated that the longest match with the string held in the input buffer 80 is the character held in the first stage thereof. The character held in the second stage of the buffer 80 is the character that caused the mismatch.

The appropriate extended string is stored in the subdictionary 13, utilizing the logic 106, by storing the code and character in the register 50 into the prefix code field 22 and character field 21, respectively, at the next available location in the subdictionary 13. The appropriate string code is assigned to the stored string by entering the extant code in the code counter 30 into the string code field 23 at the location storing the string.

The location in the subdictionary 13 at which to store the extended string is selected by accessing the addresses 24 utilizing the corresponding subdictionary address counter 100. After the extended string is stored, the corresponding subdictionary address counter 100 is incremented to indicate the next available location in the subdictionary 13.

Since, at the block 122, only the character in the first stage of the buffer 80 has been processed, the input buffer 80 is shifted once discarding the processed character from the first stage and entering one new character from the input 11 at stage n+1. The code counter 30 is advanced to the next available code utilizing the control input 31. The code size in the code size register 110 is advanced if required.

At the phase 1 block 121, as the 2 character string search was being performed at level 1, candidate matching extended strings were being transferred to the auxiliary tables 35–37. Since, at the block 122, no 2 character string match was found at level 1, the auxiliary table counters 101 are cleared.

It is appreciated that most of the operations described with respect to the phase 2*a* block 122 are performed simultaneously by the controller 95. The outputting of the code of the longest match, the entering of the extended string into the subdictionary 13, the assigning of the string code from the code counter 30, the shifting of the input buffer and the clearing of the auxiliary table counters may be executed simultaneously. After the functions of the phase 2*a* block 122 are performed, control returns to the phase 1 block 121 to find the next longest match.

If at the phase 1 block 121, a 2 character string match is found at level 1, as indicated by the "hit" signal from the hit/miss circuit 70, and the screened strings have been transferred to the auxiliary tables 35–37, control proceeds from the block 121 to the phase 2*b* block 123. At the block 123, the string codes of strings matched at the respective levels are cascaded for matching in the prefix code lists of the auxiliary tables of the next lower levels until a mismatching level occurs or all levels match.

Specifically, the string code from the string code field 23 of the 2 character string match location in the subdictionary 13 is cascaded to the code register 61 of level 2. If a match is found in the prefix code list 41 of the auxiliary table 35, the corresponding string code is cascaded to the code register 63 of level 3. Similarly, if matches are found at levels 3 to n−1, the corresponding string codes are cascaded to the next lower levels with the string code of the match from the auxiliary table of level n−1 cascaded to the code register 65 of level n. If, however, a match does not occur at a level, the cascading to lower levels is terminated.

A specific protocol for performing the cascading is that, beginning with level 2, when the "hit" signal is provided by the hit/miss circuit at a level, the string code of the match is cascaded to the next lower level. In the cascading process, when a hit/miss circuit at a level indicates the "miss" signal, the mismatching level is identified, terminating the cascading process. The cascading process also terminates at level n if all of the hit/miss circuits 70–73 indicate the "hit" signal.

It is appreciated that when the table look-up is performed in the prefix code list 41 of the auxiliary table 35–37 of a level, the count in the corresponding auxiliary table counter 101 is utilized so that only locations that are storing strings in the auxiliary table are examined. This feature contributes to the rapid determination of the longest matching string by reducing the time for a hit/miss circuit to provide the appropriate "hit" or "miss" signal.

If, at the phase 2*b* block 123, a mismatching level occurs, control continues with the phase 3a block 124. The mismatching level occurs when the string code cascaded from the previous level is not in the prefix code list 41 of the auxiliary table at the mismatching level. Accordingly, at the block 124, the code of the string that comprises the longest match with the string in the input buffer 80 is output as the string code applied to the mismatching level from the prior level. The code of the longest match, therefore, is provided by the code register 61, 63 or 65 of the mismatching level and transferred to the longest match register 90. The code of the longest match is provided at the compressed output 12 via the code size control 91 as previously described. The mismatching character that "broke" the match resides in the character register 60, 62 or 64 of the mismatching level. The logic 105 is utilized in determining the longest match.

The appropriate extended string is entered, utilizing the logic 106, into the subdictionary of the mismatching level by entering the code in the code register and the character in the character register at the mismatching level into the prefix code field 22 and the character field 21, respectively, of the subdictionary at the mismatching level. The string code is assigned to the extended string by entering the code from the code counter 30 into the string code field 23 of the subdictionary location at which the extended string is stored. The location at which to store the extended string is provided by the corresponding subdictionary address counter 100. After storing the extended string, the corresponding subdictionary address counter 100 is incremented to the next available address 24. The code counter 30 is advanced to the next available string code and the code size in the code size register 110 is advanced if required.

The input buffer 80 is shifted entering new characters from the input 11 at the stage n+1 until the mismatching character is in the first buffer stage. The level at which the mismatch occurs determines the number of shifts to be applied by the shift control 81 to the input buffer 80. For example, if the mismatching level is level 3, three shifts are required to bring the mismatching character in the fourth stage of the buffer 80 into the first stage thereof. As part of the processing of the phase 3*a* block 124, the auxiliary table counters 101 and the code registers 61, 63 and 65 of levels 2 to n are cleared.

It is appreciated that many of the functions of the phase 3*a* block 124 are simultaneously performed. The outputting of the longest match, the entering of the extended string into the subdictionary, the assigning of the string code from the code counter 30, the shifting of the input buffer 80 and the clearing of the auxiliary table counters 101 may be concurrently executed. After the phase 3*a* functions of the block 124 are performed, control returns to the phase 1 block 121 to find the next longest match.

If, at the phase 2*b* block 123, all levels match, control proceeds from the block 123 to the phase 3*b* block 125. At the block 125, all levels match since at each of levels 2 to n, the applied string code from the previous level is in the prefix code list 41 of the auxiliary table of the level. When this occurs, the n+1 character string held in the input buffer 80 is already stored in the subdictionary 16 of level n. Accordingly, the code of the longest match is derived from the string code field 42 of the auxiliary table 37. The code of the longest match is the string code corresponding to the prefix code in the prefix code list 41 that matches the code in the code register 65.

The code of the longest match is provided at the compressed output 12 via the longest match register 90 and the code size control 91 as previously described. The input buffer 80 is shifted entering n+1 new characters from the input 11. The code counter 30 is advanced to the next available code utilizing the input 31 as previously described. The code size in the code size register 110 is advanced if required. The auxiliary table counters 101 and the code registers 61, 63 and 65 at the levels 2 to n are cleared. After the functions of the phase 3*b* block 125 are executed, control returns to the phase 1 block 121 to find the next longest match.

It is appreciated that operations of the phase 3*b* block 125 are simultaneously performed. The outputting of the longest match, the shifting of the input buffer 80, the advancing of the code counter 30 and the clearing of the auxiliary table counters 101 may be concurrently executed.

Figure 4:
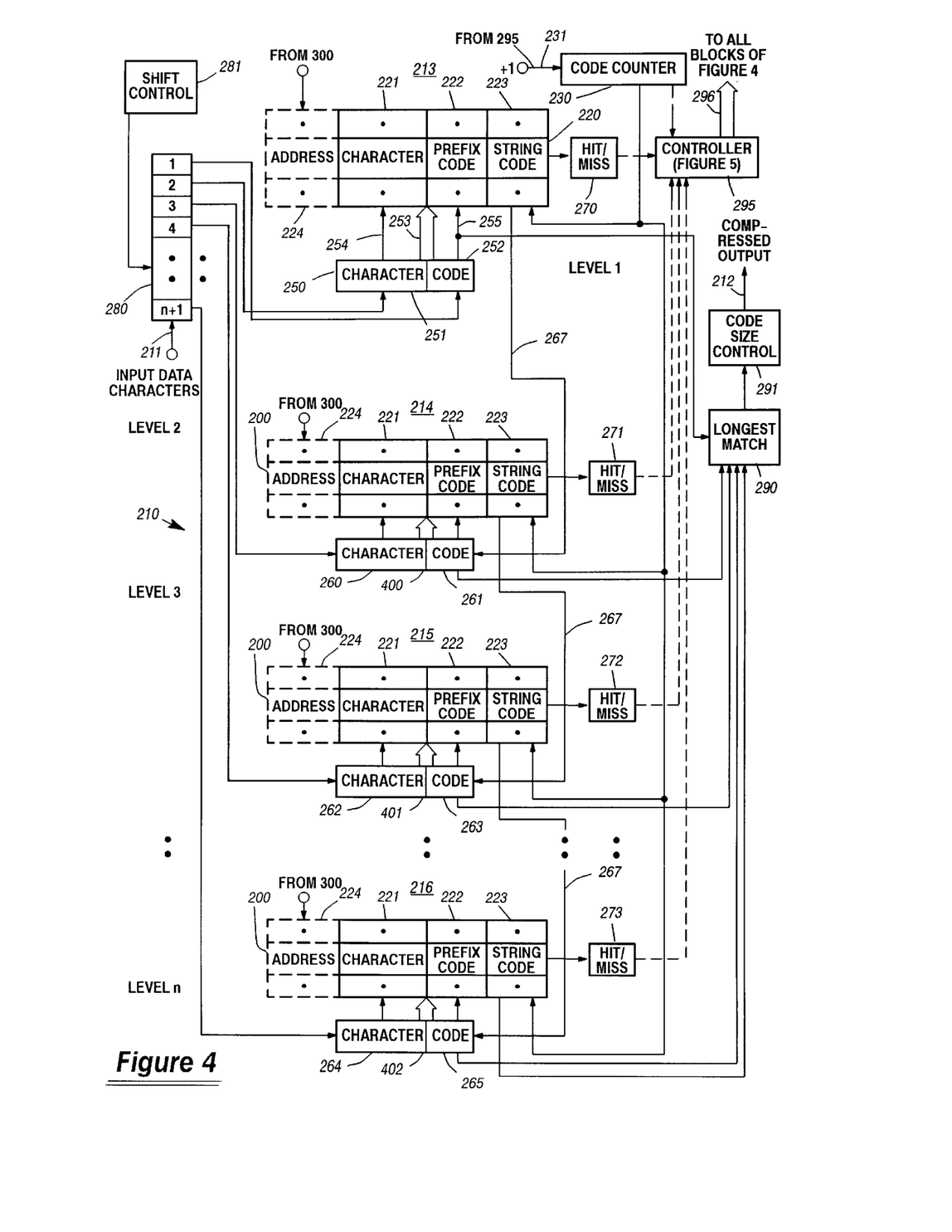
FIG. 4 is a schematic block diagram of a data compressor for compressing data in accordance with an alternative best made embodiment of the invention.
Figure 5:
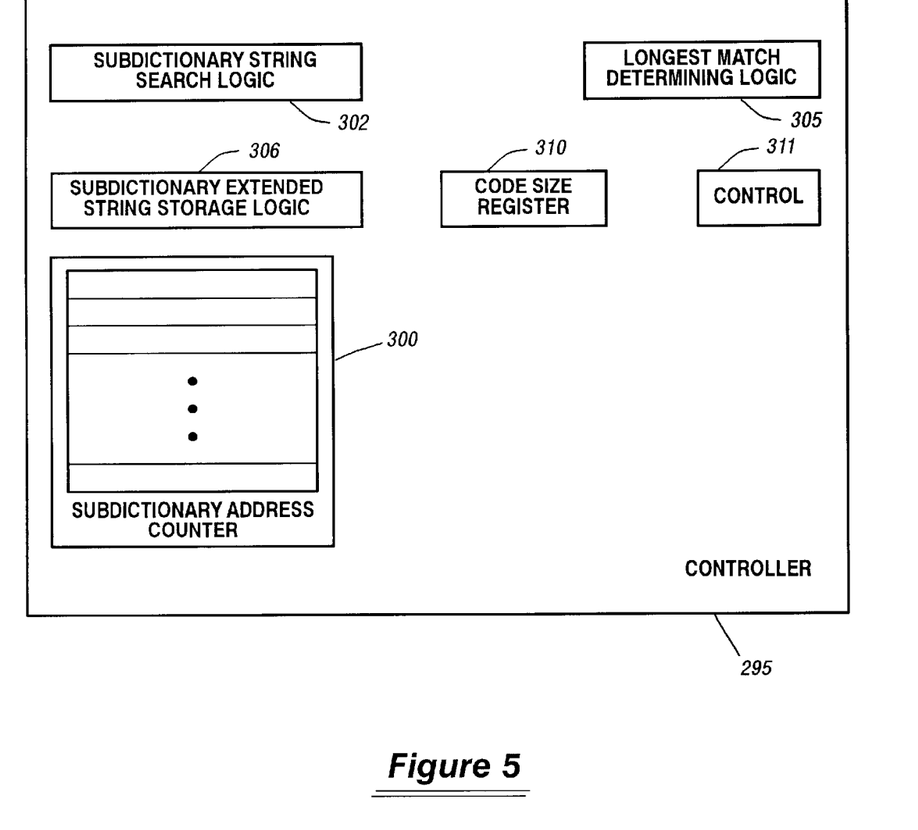
FIG. 5 is a schematic block diagram illustrating details of the controller of the embodiment of FIG. 4.

Referring to FIGS. 4 and 5, with continued reference to FIGS. 1 and 2, an alternative embodiment of the invention is illustrated. Since numerous elements of the FIGS. 4 and 5 embodiment are the same as elements of the FIGS. 1 and 2 embodiment, an element of FIGS. 4 and 5 is given a reference numeral that is, for correlation, 200 greater than the reference numeral of the corresponding element in FIGS. 1 and 2. The descriptions given above with respect to the elements of FIGS. 1 and 2 apply to the corresponding elements of FIGS. 4 and 5.

Basically, the FIGS. 4 and 5 embodiment differs from that of FIGS. 1 and 2 in that the auxiliary tables 35–37 are not utilized in FIG. 4. Accordingly, the individual character and code registers 60–65 of FIG. 1 are combined into registers 400–402 at levels 2 to n that are each identical to the register 50 of FIG. 1. For correlation, the character and code fields of the registers 400–402 are given reference numerals that are 200 greater than the reference numerals of the corresponding individual character and code registers 60–65 of FIG. 1.

Generally, in the manner described above with respect to FIG. 1, the characters in the first and second stages of the input buffer 280 are applied, respectively, to the code field 252 and character field 251 of the register 250. Similarly, the characters in the stages 3 to n+1 of the buffer 280 are applied to the respective character fields 260, 262 and 264 of the registers 401–402. A string code in the field 223 of a matching string in a subdictionary of levels 1 to n–1 is cascaded, via paths 267, into the code field 261, 263, 265 of the register 400–402 of the next level.

Since the auxiliary tables 35–37 are not utilized in FIG. 4, the hit/miss circuits 271–273 are coupled directly to the respective subdictionaries 214–216. The hit/miss circuits 271–273 operate in the manner described above with respect to the hit/miss circuit 70 coupled to the subdictionary 13. It is appreciated that the code of the longest match is provided to the longest match register 290 from the code field 252, 261, 263 or 265 of the register 250, 400, 401 or 402 of the mismatching level generally in the manner described above with respect to the code field 52 of register 50 and the code registers 61, 63 and 65 of FIG. 1.

In FIG. 5, which illustrates details of the controller 295, the subdictionary string search logic 302 is utilized for searching each of the subdictionaries 213–216 for matching strings in the manner described above with respect to the subdictionary 13 of FIG. 1. Furthermore, the subdictionary extended string storage logic 306 stores extended strings in the subdictionaries 213–216 from the respective registers 250, 400–402 in the manner described above with respect to the subdictionary 13 and register 50 of FIG. 1.

It will be appreciated that the subdictionaries 213–216 will store exclusively 2, 3, 4, . . . and n+1 character strings, respectively, by the operations of the compressor 210 in a manner similar to that described above with respect to the FIGS. 1 and 2 embodiment.

Figure 6:
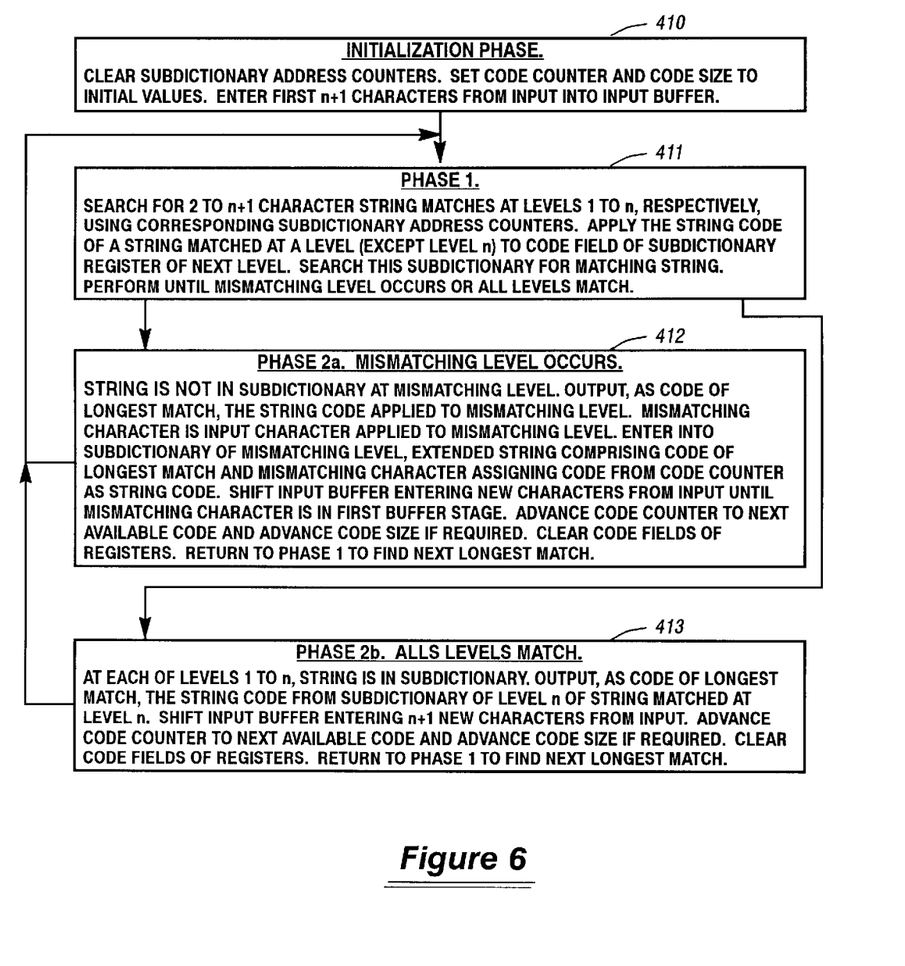
FIG. 6 is a chart, similar to FIG. 3, summarizing the functions and illustrating the operational flow of the FIGS. 4 and 5 embodiment.

Referring to FIG. 6, with continued reference to FIGS. 4 and 5, a summary and flow diagram of the operations performed by the compressor 210 is illustrated. The operations are described in terms of an initialization phase and repetitive operational phases 1 and 2. The initialization phase is denoted by a block 410, phase 1 by a block 411 and phase 2 by blocks 412 and 413.

At initialization phase block 410, operations similar to those described above with respect to the block 120 of FIG. 3 are performed in that the subdictionary address counters 300 are cleared and the code counter 230 and code size register 310 are set to initial values. Further, at the block 410, the first n+1 characters from the input 211 are entered into the input buffer 280 with the first character of the input stream residing in the first stage of the buffer. It is appreciated that the clearing, setting and data entering operations of the block 410 may be simultaneously performed.

During each iteration of the compressor 210, the operations of phases 1 and 2 determine the longest string in the buffer 280 that matches a string stored in the subdictionaries 213–216 of levels 1 to n. The code of the longest match is provided at the compressed output 212 and the input buffer 280 is shifted, in preparation for the next longest match search iteration, so that the mismatching character resides in the first stage thereof. New characters from the input 211 are entered at stage n+1 to replace the already processed characters.

At the beginning of each iteration of the compressor 210, processing enters the phase 1 block 411. At the block 411, a search is performed for 2 to n+1 character string matches at levels 1 to n, respectively, using corresponding subdictionary address counters.

Thus, at the block 411, a subdictionary 210–216 is searched, utilizing the logic 302, for the data character string represented by the prefix code and character held in the register 250, 400–402 associated with the subdictionary. The search may be performed associatively, as described above, by examining the locations in the subdictionary that are storing previously entered strings. The associated subdictionary address counter 300 is utilized by the controller 295 to determine which addresses 224 of the subdictionary to examine so as to only access locations at which strings are stored. If the string held in the register is stored at an examined location, the "hit" signal is provided by the associated hit/miss circuit. If the string is not stored in the subdictionary, the "miss" signal is indicated.

Further, at the phase 1 block 411, the string code of a string matched at a level (except level n) is applied to the code field of the subdictionary register of the next level and the subdictionary is searched for a matching string. Thus, at the block 411, the string codes of strings matched at the respective levels are cascaded for matching in the subdictionaries of the next lower levels until a mismatching level occurs or all levels match.

Specifically, the string code from the string code field 223 of a data character string match location in the subdictionary 213 is cascaded to the code field 261 of the register 400 of level 2. If a match is found in the subdictionary 214, the corresponding string code is cascaded to the code field 263 of the register 401 of level 3. Similarly, if matches are found at levels 3 to n–1, the corresponding string codes are cascaded to next lower levels with the string code of the match from the subdictionary of level n–1 cascaded to the code field 265 of the register 402 of level n. If, however, a match does not occur at a level, the cascading to lower levels is terminated.

A specific protocol for performing the cascading is that when the "hit" signal is provided by the hit/miss circuit at a level, the string code of the match is cascaded to the next lower level. In the cascading process, when a hit/miss circuit at a level indicates the "miss" signal, the mismatching level is identified, terminating the cascading process. The cascading process also terminates at level n if all of the hit/miss circuits 270–273 indicate the "hit" signal.

If, at the phase 1 block 411, a mismatching level occurs, control continues with the phase 2a block 412. A mismatching level occurs when the string represented by the string code cascaded from the previous level, extended by the input character applied to the level, is not in the subdictionary at the level. Accordingly, at the block 412, the code of the string that comprises the longest match with the string in the input buffer 280 is output as the string code applied to the mismatching level from the prior level. It is appreciated that if the mismatch should occur at level 1, the longest match is the single character string provided from the first stage of the input buffer 280 to the code field 252 of the register 250.

The code of the longest match, therefore, is provided by the code field 252, 261, 263 or 265 of the respective register 250, 400–402 of the mismatching level and transferred to the longest match register 290. The code of the longest match is provided at the compressed output 212 via the code size control 291 as previously described. The mismatching character that "broke" the match resides in the character field 251, 260, 262 or 264 of the respective register 250, 400–402 of the mismatching level. The logic 305 is utilized in determining the longest match.

The appropriate extended string is entered, utilizing the logic 306, into the subdictionary of the mismatching level by entering, into the prefix code field 222 and the character field 221 of the subdictionary at the mismatching level, the code in the code field and the character in the character field, respectively, of the register at the mismatching level. The string code is assigned to the extended string by entering the code from the code counter 230 into the string code field 223 of the subdictionary location at which the extended string is stored.

The location at which to store the extended string is provided by the corresponding subdictionary address counter 300. After storing the extended string, the corresponding subdictionary address counter 300 is incremented to the next available address 224. The code counter 230 is advanced to the next available string code and the code size in the code size register 310 is advanced if required. Additionally, the code fields 261, 263 and 265 of the registers 400–402 at the levels 2 to n are cleared.

The input buffer 280 is shifted entering new characters from the input 211 at the stage n+1 until the mismatching character is in the first buffer stage. The level at which the mismatch occurs determines the number of shifts to be applied by the shift control 281 to the input buffer 280. For example, if the mismatching level is level 3, three shifts are required to bring the mismatching character in the fourth stage of the buffer 280 into the first stage thereof.

It is appreciated that many of the functions of the phase 2a, block 412 are simultaneously performed. The outputting of the longest match, the entering of the extended string into the subdictionary, the assigning of the string code from the code counter 230 and the shifting of the input buffer 280 may be concurrently executed. After the phase 2a functions of the block 412 are performed, control returns to the phase 1 block 411 to find the next longest match.

If, at the phase 1 block 411, all levels match, control proceeds from the block 411 to the phase 2b block 413. At the block 413, all levels match since at each of levels 1 to n, the string defined in the register at the level is in the subdictionary of the level. When this occurs, the n+1 character string held in the input buffer 280 is already stored in the subdictionary 216 of level n. Accordingly, the code of the longest match is derived from the string code field 223 of the subdictionary 216 at the subdictionary location storing the string matched at level n.

The code of the longest match is provided at the compressed code output 212 via the longest match register 290 and the code size control 291 in the manner previously described. The input buffer 280 is shifted entering n+1 new characters from the input 211. The code counter 230 is advanced to the next available code utilizing the input 231 in the manner previously described. The code size in the code size register 310 is advanced if required. The code fields 261, 263 and 265 of the registers 400–402 at the levels 2 to n are cleared. After the functions of the phase 2b block 413 are executed, control returns to the phase 1 block 411 to find the next longest match.

It is appreciated that operations of the phase 2b block 413 are simultaneously performed. The outputting of the longest match, the shifting of the input buffer 280 and the advancing of code counter 230 may be concurrently executed.

Figure 7:
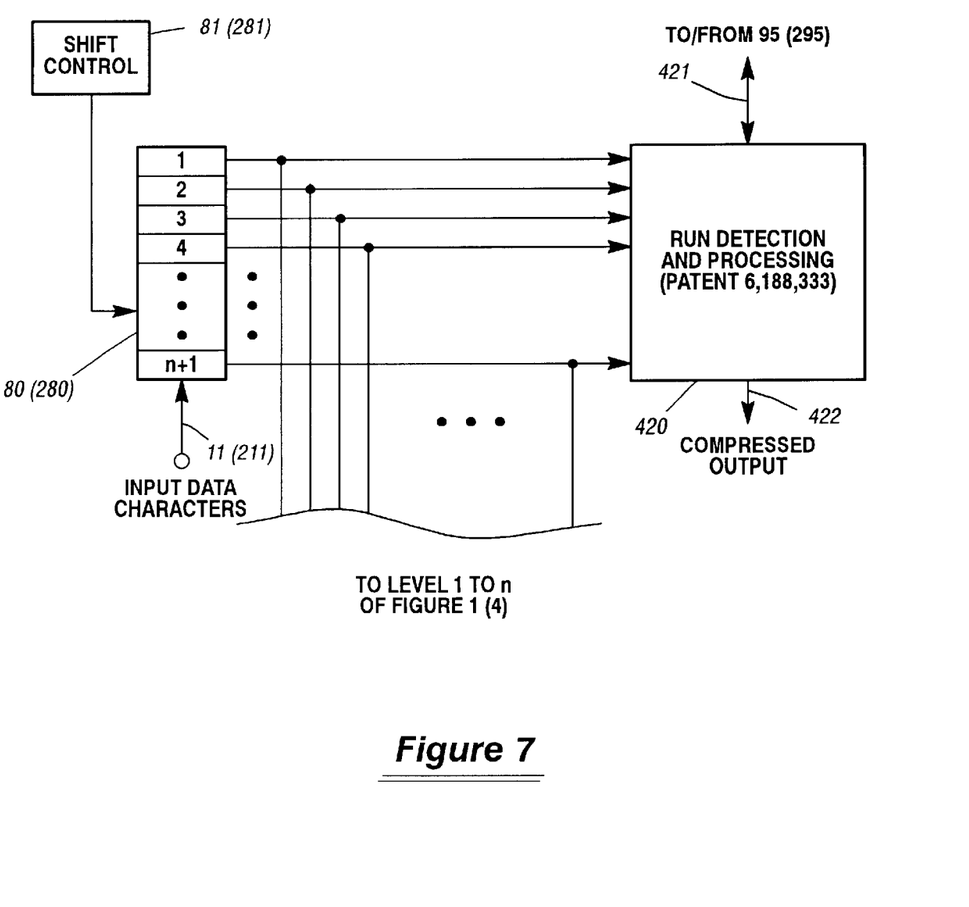
FIG. 7 is a schematic block diagram of an addition to the embodiments of FIGS. 1 and 2 and FIGS. 4 and 5 for providing enhanced processing of data character runs.

Referring to FIG. 7, where like reference numerals indicate like components with respect to FIGS. 1 and 4 and with continued reference to FIGS. 1 and 4, an addition to FIG. 1 or FIG. 4 for providing enhanced processing of data character runs is illustrated. A block 420 schematically represents the run detection and processing of the compressor of said U.S. Pat. No. 6,188,333 which is incorporated herein in its entirety. The compression apparatus of the block 420 communicates with the controller 95 (295) via a bus 421 and provides compressed codes at an output 422. The compressor 420 utilizes the input buffer 80 (280) and the shift control 81 (281) to provide the input look-ahead data required by the apparatus 420. In the embodiment of FIG. 7, data character runs are processed by the apparatus 420 while non-run input data is processed by the above described embodiments.

It is believed that by utilizing the architecture of the present invention, fewer strings will be searched in determining a longest match than in conventional arrangements. For example, in the FIGS. 1 and 2 embodiment, only the potential matches extracted from the subdictionaries to the auxiliary tables are searched in determining the longest matching string.

It is appreciated that the compressed code output provided by the above described embodiments is compatible with standard LZW decompressors and the data character stream corresponding to the compressed code can be recovered thereby. Although the above described embodiments of the invention are LZW based, it is appreciated that the architecture of the present invention can be utilized with other known dictionary based compression methodologies. Although the search and storage functions at the levels in the above embodiments are explained in terms of associative memory subdictionaries, it is appreciated that other search and storage methodologies, such as hashing and sibling lists, may also be utilized.

It is further appreciated that the input data characters can be over any size alphabet having any corresponding character bit size. For example, the data characters can be textual data, image pixel data or bit map data. The input data can also be binary characters over the two-character binary alphabet 1 and 0 having a 1-bit size character.

In selecting a number of levels in which to implement an embodiment, the statistics of the input data can be analyzed to choose an appropriate number of levels so as to optimize performance. The number of levels can also be chosen so that there will usually be a mismatching level at which to store an extended string.

Additionally, it is appreciated that the number of locations in the subdictionaries can vary from level to level and can also be chosen in accordance with the statistics of the data. For example, since it is expected that 2-character string matches may be more prevalent than longer string matches, the subdictionary of level 1 can include more locations than a subdictionary at a lower level. If the statistics of the string length distribution is known for the type of input data, the number of locations in each subdictionary can be selected in accordance with the statistics so as to minimize memory requirements.

It is appreciated that with respect to the FIGS. 1 and 2 embodiment, it is not necessary to clear the auxiliary tables between longest match determinations. By the use of the auxiliary table counters, only strings in the auxiliary tables that are currently applicable are examined.

Although an appropriate string code cascading protocol is described above, an alternative protocol may be utilized to provide an additional speed enhancement. In the alternative protocol, the operations described above for an embodiment can be simultaneously initiated with all of the stored auxiliary table entries or subdictionary strings continuously searched, under control of the auxiliary table counters or subdictionary address counters, until "hit" signals begin to occur starting with level 1. The controller 95 can examine the hits and misses determining when a final status has occurred at a mismatching level or when all of the levels match. This action may be compared to that of a "slot machine" where the different levels are spinning until they sequentially settle to a final result.

For decompressor compatibility, a maximum code limit can be imposed on the code counter 30 (230) signifying that the compressor storage is full. Such a maximum code can be 4096 as is typically utilized. When the code counter attains the maximum count, the compressor is considered as full with no further string storage occurring. A decompressor can also terminate string storage when the decompressor code counter attains the maximum code for system compatibility.

A number of refinements can be incorporated into the above described embodiments. For example, if an auxiliary table counter or a subdictionary address counter is zero, no strings are stored at the associated level so matching can be terminated thereat. Additionally, the controller 95 (295) can perform efficient operations based on the state of the compressor. For example, when the first n+1 characters are entered into the input buffer, abbreviated operations can be performed since at that point no strings are stored at any level.

It is appreciated that the above described embodiments of the invention may be implemented in hardware, firmware, software or a combination thereof. Discrete circuit embodiments may readily be implemented for performing the various described functions. In a software embodiment, appropriate modules programmed with coding readily generated from the above descriptions may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. Data compression apparatus for compressing an input stream of data characters into an output stream of compressed codes, comprising a plurality of storage means for storing strings of data characters encountered in said input stream, said stored strings having respective string codes associated therewith, said storage means being arranged in respective levels so that the strings stored in the storage means at a level comprise one character more than the strings stored in the storage means at the level prior thereto, means for fetching a plurality of data characters from said input stream and applying the fetched characters to said levels, respectively, means for searching said fetched characters by comparing said fetched characters to said stored strings to determine the longest match therewith, said longest match being determined by one of said fetched characters resulting in a mismatch at one of said levels, said means for searching including means for cascading the string code of a string matched at a level to the next level and means for searching the strings stored in the storage means at said next level for a string corresponding to said cascaded string code extended by the fetched character applied to said next level, means for outputting the string code associated with said longest match so as to provide said output stream of compressed codes, and means for inserting an extended string into said storage means, said extended string comprising said longest match extended by the fetched character resulting in said mismatch, said extended string being stored in said storage means at the mismatching level.

2. The compression apparatus of claim 1 wherein said means for searching comprises means for searching the strings stored in the storage means at a particular level for a string comprising a string matched at the level prior thereto extended by the fetched character applied to said particular level, and means for applying the string code of a string matched at said particular level to the next level.

3. The compression apparatus of claim 2 wherein said means for searching is operative for determining a level whereat the storage means at the level is not storing a string comprising the string matched at the level prior thereto extended by the fetched character applied to the level, thereby determining said mismatching level, said string code associated with said longest match comprises the string code applied to said mismatching level from the level prior thereto, and said extended string comprises said code associated with said longest match extended by the fetched character applied to said mismatching level.

4. The compression apparatus of claim 3 wherein said means for fetching comprises an input buffer for holding said plurality of data characters fetched from said input stream and for applying said fetched characters to said levels, and means for shifting said plurality of data characters in said input buffer so that the character applied to said mismatching level is shifted to a first stage of said input buffer so as to provide the first character of a next longest match.

5. The compression apparatus of claim 2 wherein said data characters are from an alphabet of data characters, a string stored in said storage means comprises a prefix string of at least one of said characters followed by an extension character, said storage means at said particular level comprises a subdictionary storing strings having the same number of data characters, said storage means at said particular level includes an auxiliary table, and said means for searching includes means for screening strings from said subdictionary where the screened strings have an extension character matching the fetched character applied to said particular level and storing the screened strings in said auxiliary table.

6. The compression apparatus of claim 1 wherein
said data characters are from an alphabet of data characters,
a string stored in said storage means comprises a prefix string of at least one of said characters followed by an extension character,
said plurality of storage means comprises a plurality of subdictionaries arranged in said levels, said levels including a first level, a subdictionary at a level storing strings having the same number of data characters,
said storage means at said levels following said first level further including respective auxiliary tables, and
said means for searching includes means for screening strings from the subdictionaries at said levels following said first level where the screened strings have extension characters matching the fetched characters applied to the respective levels and storing the screened strings in the associated auxiliary tables at the respective levels.

7. The compression apparatus of claim 6 wherein said searching means comprises
means for searching the strings stored in the subdictionary at said first level,
means for applying the string code of a string matched at a level to the auxiliary table at the next level, and
means for searching the auxiliary table at a particular level for a string having a prefix string code matching the string code applied to the auxiliary table at said particular level from the level prior thereto.

8. The compression apparatus of claim 7 wherein said searching means is operative for searching the subdictionary at said first level and simultaneously screening the strings from the subdictionaries at the levels following said first level and storing the screened strings in the associated auxiliary tables.

9. The compression apparatus of claim 7 wherein
said searching means is operative for determining a level at which no string stored in the auxiliary table at the level has a prefix code matching the string code applied from the level prior thereto, thereby determining said mismatching levels,
said string code associated with said longest match comprises the string code applied to said mismatching level from the level prior thereto, and
said extended string is stored in the subdictionary at said mismatching level and comprises said string code associated with said longest match extended by the fetched character applied to said mismatching level.

10. The compression apparatus of claim 9 wherein said means for fetching comprises
an input buffer having a plurality of stages for holding said plurality of data characters fetched from said input stream and for applying said fetched characters to said levels,
said plurality of stages including a first stage and a second stage for holding a two character string for searching in the subdictionary of said first level, and
means for shifting said plurality of data characters in said stages so that the character applied to said mismatching level is shifted to said first stage so as to provide the first character of a next longest match.

11. The compression apparatus of claim 10 wherein said shifting means is operative to shift new data characters from said input stream into said input buffer.

12. The compression apparatus of claim 10 wherein, if said mismatching level is said first level, said searching means is operative in providing the string code associated with said longest match as the prefix code of said two character string not matched in the subdictionary at said first level.

13. The compression apparatus of claim 6 further including auxiliary table counters corresponding, respectively, to said auxiliary tables for maintaining respective counts of the number of strings transferred from said subdictionaries to said auxiliary tables.

14. The compression apparatus of claim 6 further including a plurality of subdictionary address counters corresponding to said plurality of subdictionaries, respectively, utilized in accessing locations in said subdictionaries.

15. The compression apparatus of claim 1 wherein
said data characters are from an alphabet of data characters,
a string stored in said storage means comprises a prefix string of at least one of said characters followed by an extension character, and
said plurality of storage means comprises a plurality of subdictionaries arranged in said levels, a subdictionary at a level storing strings having the same number of data characters, a subdictionary storing a string by storing, at a subdictionary location, the code of the string prefix, the extension character of the string and the string code of the string.

16. The compression apparatus of claim 15 wherein said means for fetching comprises
an input buffer having a plurality of stages for holding said plurality of data characters fetched from said input stream and for applying said fetched characters to said levels,
said plurality of stages including a first stage and a second stage, and
means for shifting said plurality of data characters in said stages so that the character applied to said mismatching level is shifted to said first stage so as to provide the first character of a next longest match.

17. The compression apparatus of claim 16 wherein said levels include a first level and said means for searching comprises
means for searching the strings stored in the subdictionary at said first level for a two character string comprising the characters held in said first and second stages of said input buffer, the character held in said first stage comprising the prefix string of said two character string,
means for applying the string code of a string matched at a level to the next level, and
means for searching the strings stored in a subdictionary at a particular level following said first level for a string having a prefix code matching a string code applied to said particular level from the level prior thereto and having an extension character matching the data character applied to said particular level from said input buffer,
said mismatching level comprising a level at which the subdictionary thereat is not storing a string matching the string defined by the string code applied from the level prior thereto and by the extension character applied from the input buffer to the level, the string code associated with said longest match being provided by the string code applied to said mismatching level from said level prior thereto.

18. The compression apparatus of claim 17 wherein, if said mismatching level is said first level, said searching means is operative in providing the string code associated with said longest match as the code of the prefix of said two character string not matched in the subdictionary at said first level.

19. The compression apparatus of claim 1 wherein said means for fetching comprises an input buffer for holding said plurality of data characters fetched from said input stream and for applying said fetched characters to said levels, said compression apparatus further including run detection and processing means responsive to the data characters held in said input buffer for detecting a data character run in said input stream and providing an output stream of compressed codes corresponding to said run.

20. A data compression method for compressing an input stream of data characters into an output stream of compressed codes, comprising storing strings of data characters encountered in said input stream in a plurality of storage means, said stored strings having respective string codes associated therewith, said storage means being arranged in respective levels so that the strings stored in the storage means at a level comprise one character more than the strings stored in the storage means at the level prior thereto, fetching a plurality of data characters from said input stream and applying the fetched characters to said levels, respectively, searching said fetched characters by comparing said fetched characters to said stored strings to determine the longest match therewith, said longest match being determined by one of said fetched characters resulting in a mismatch at one of said levels, said searching step including cascading the string code of a string matched at a level to the next level and searching the strings stored in the storage means at said next level for a string corresponding to said cascaded string code extended by the fetched character applied to said next level, outputting the string code associated with said longest match so as to provide said output stream of compressed codes, and inserting an extended string into said storage means, said extended string comprising said longest match extended by the fetched character resulting in said mismatch, said extended string being stored in said storage means at the mismatching level.

21. The compression method of claim 20 wherein said searching step comprises searching the strings stored in the storage means at a particular level for a string comprising a string matched at the level prior thereto extended by the fetched character applied to said particular level, and applying the string code of a string matched at said particular level to the next level.

22. The compression method of claim 21 wherein said searching step includes determining a level whereat the storage means at the level is not storing a string comprising the string matched at the level prior thereto extended by the fetched character applied to the level, thereby determining said mismatching level, said string code associated with said longest match comprises the string code applied to said mismatching level from the level prior thereto, and said extended string comprises said code associated with said longest match extended by the fetched character applied to said mismatching level.

23. The compression method of claim 22 wherein said fetching step comprises utilizing an input buffer holding said plurality of data characters fetched from said input stream and applying said fetched characters to said levels, and shifting said plurality of data characters in said input buffer so that the character applied to said mismatching level is shifted to a first stage of said input buffer so as to provide the first character of a next longest match.

24. The compression method of claim 21 wherein said data characters are from an alphabet of data characters, a string stored in said storage means comprises a prefix string of at least one of said characters followed by an extension character, said storage means at said particular level comprises a subdictionary storing strings having the same number of data characters, said storage means at said particular level includes an auxiliary table, and said searching step includes screening strings from said subdictionary where the screened strings have an extension character matching the fetched character applied to said particular level and storing the screened strings in said auxiliary table.

25. The compression method of claim 20 wherein said data characters are from an alphabet of data characters, a string stored in said storage means comprises a prefix string of at least one of said characters followed by an extension character, said plurality of storage means comprises a plurality of subdictionaries arranged in said levels, said levels including a first level, a subdictionary at a level storing strings having the same number of data characters, said storage means at said levels following said first level further including respective auxiliary tables, and said searching step includes screening strings from the subdictionaries at said levels following said first level where the screened strings have extension characters matching the fetched characters applied to the respective levels and storing the screened strings in the associated auxiliary tables at the respective levels.

26. The compression method of claim 25 wherein said searching step comprises searching the strings stored in the subdictionary at said first level, applying the string code of a string matched at a level to the auxiliary table at the next level, and searching the auxiliary table at a particular level for a string having a prefix string code matching the string code applied to the auxiliary table at said particular level from the level prior thereto.

27. The compression method of claim 26 wherein said searching step includes searching the subdictionary at said first level and simultaneously screening the strings from the subdictionaries at the levels following said first level and storing the screened strings in the associated auxiliary tables.

28. The compression method of claim 26 wherein
said searching step includes determining a level at which no string stored in the auxiliary table at the level has a prefix code matching the string code applied from the level prior thereto, thereby determining said mismatching level,
said string code associated with said longest match comprises the string code applied to said mismatching level from the level prior thereto, and
said inserting step includes storing said extended string in the subdictionary at said mismatching level, said extended string comprising said string code associated with said longest match extended by the fetched character applied to said mismatching level.

29. The compression method of claim 28 wherein said fetching step comprises
utilizing an input buffer having a plurality of stages holding said plurality of data characters fetched from said input stream and applying said fetched characters to said levels,
said plurality of stages including a first stage and a second stage for holding a two character string for searching in the subdictionary of said first level, and
shifting said plurality of data characters in said stages so that the character applied to said mismatching level is shifted to said first stage so as to provide the first character of a next longest match.

30. The compression method of claim 29 wherein said shifting step includes shifting new data characters from said input stream into said input buffer.

31. The compression method of claim 29 wherein, if said mismatching level is said first level, said searching step includes providing the string code associated with said longest match as the prefix code of said two character string not matched in the subdictionary at said first level.

32. The compression method of claim 25 further including maintaining respective counts of the number of strings transferred from said subdictionaries to said auxiliary tables in auxiliary table counters respectively corresponding to said auxiliary tables.

33. The compression method of claim 25 further including utilizing a plurality of subdictionary address counters corresponding to said plurality of subdictionaries, respectively, in accessing locations in said subdictionaries.

34. The compression method of claim 20 wherein
said data characters are from an alphabet of data characters,
a string stored in said storage means comprises a prefix string of at least one of said characters followed by an extension character,
said plurality of storage means comprises a plurality of subdictionaries arranged in said levels, a subdictionary at a level storing strings having the same number of data characters, and
said storing step includes storing a string in a subdictionary by storing, at a subdictionary location, the code of the string prefix, the extension character of the string and the string code of the string.

35. The compression method of claim 34 wherein said fetching step comprises
utilizing an input buffer having a plurality of stages holding said plurality of data characters fetched from said input stream and applying said fetched characters to said levels,
said plurality of stages including a first stage and a second stage, and
shifting said plurality of data characters in said stages so that the character applied to said mismatching level is shifted to said first stage so as to provide the first character of a next longest match.

36. The compression method of claim 35 wherein said levels include a first level and said searching step comprises
searching the strings stored in the subdictionary at said first level for a two character string comprising the characters held in said first and second stages of said input buffer, the character held in said first stage comprising the prefix string of said two character string,
applying the string code of a string matched at a level to the next level, and
searching the strings stored in a subdictionary at a particular level following said first level for a string having a prefix code matching a string code applied to said particular level from the level prior thereto and having an extension character matching the data character applied to said particular level from said input buffer,
said mismatching level comprising a level at which the subdictionary thereat is not storing a string matching the string defined by the string code applied from the level prior thereto and by the extension character applied from the input buffer to the level,
the string code associated with said longest match being provided by the string code applied to said mismatching level from said level prior thereto.

37. The compression method of claim 36 wherein, if said mismatching level is said first level, said searching step includes providing the string code associated with said longest match as the code of the prefix of said two character string not matched in the subdictionary at said first level.

38. The compression method of claim 20 wherein said fetching step comprises utilizing an input buffer holding said plurality of data characters fetched from said input stream and applying said fetched characters to said levels, said compression method further including
detecting a data character run in said input stream by utilizing the data characters held in said input buffer, and
providing an output stream of compressed codes corresponding to said run.

* * * * *